(12) United States Patent
Arney et al.

(10) Patent No.: US 10,892,756 B2
(45) Date of Patent: Jan. 12, 2021

(54) REDUCING NOISE EFFECTS IN ELECTROSTATIC DISCHARGE CIRCUITS

(71) Applicant: Texas Instruments Incorporated, Dallas, TX (US)

(72) Inventors: Benjamin Lee Arney, Allen, TX (US); Sigfredo Emanuel González Díaz, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 417 days.

(21) Appl. No.: 15/854,440

(22) Filed: Dec. 26, 2017

(65) Prior Publication Data

US 2019/0199351 A1    Jun. 27, 2019

(51) Int. Cl.
*H03K 19/003*    (2006.01)
*H01L 27/02*    (2006.01)

(52) U.S. Cl.
CPC ... *H03K 19/00315* (2013.01); *H01L 27/0262* (2013.01); *H01L 27/0285* (2013.01); *H01L 27/0292* (2013.01)

(58) Field of Classification Search
CPC .......... H03K 19/00315; H01L 27/0262; H01L 27/0285; H01L 27/0292
USPC .......................................................... 361/56
See application file for complete search history.

(56) References Cited

U.S. PATENT DOCUMENTS

| 5,852,541 | A | * | 12/1998 | Lin | ..................... H01L 27/0248 |
|---|---|---|---|---|---|
| | | | | | 361/111 |
| 2003/0214768 | A1 | * | 11/2003 | Lin | ..................... H01L 27/0274 |
| | | | | | 361/56 |
| 2004/0251917 | A1 | | 12/2004 | Blanchard | |
| 2009/0128970 | A1 | | 5/2009 | Deval | |
| 2015/0229116 | A1 | * | 8/2015 | Reinprecht | .......... H02H 1/0007 |
| | | | | | 361/56 |
| 2016/0155882 | A1 | | 6/2016 | Tian | |
| 2017/0092637 | A1 | | 3/2017 | Bakalski | |
| 2019/0385057 | A1 | * | 12/2019 | Litichever | ................ G06N 3/08 |

FOREIGN PATENT DOCUMENTS

WO    2004040761 A1    5/2004

OTHER PUBLICATIONS

Nuts & Volts Magazine—DC Voltage Converter Circuits Apr. 23, 2016 (Year: 2016).*
Ramon Vargas Patron, "Diode Charge Pump AM-FM Demodulators" Jan. 31, 2005 (Year: 2005).*

* cited by examiner

*Primary Examiner* — Kevin J Comber
(74) *Attorney, Agent, or Firm* — Lawrence J. Bassuk; Charles A. Brill; Frank D. Cimino

(57) ABSTRACT

A DPI circuit reduces noise effects in an ESD circuit when coupled between an ESD circuit and a protected pin. The DPI circuit includes an NMOS transistor coupled between an output node and a lower rail and a charge pump coupled between the input node and the gate of the first NMOS transistor. A resistor is coupled between the gate of the first NMOS transistor and the lower rail.

21 Claims, 15 Drawing Sheets

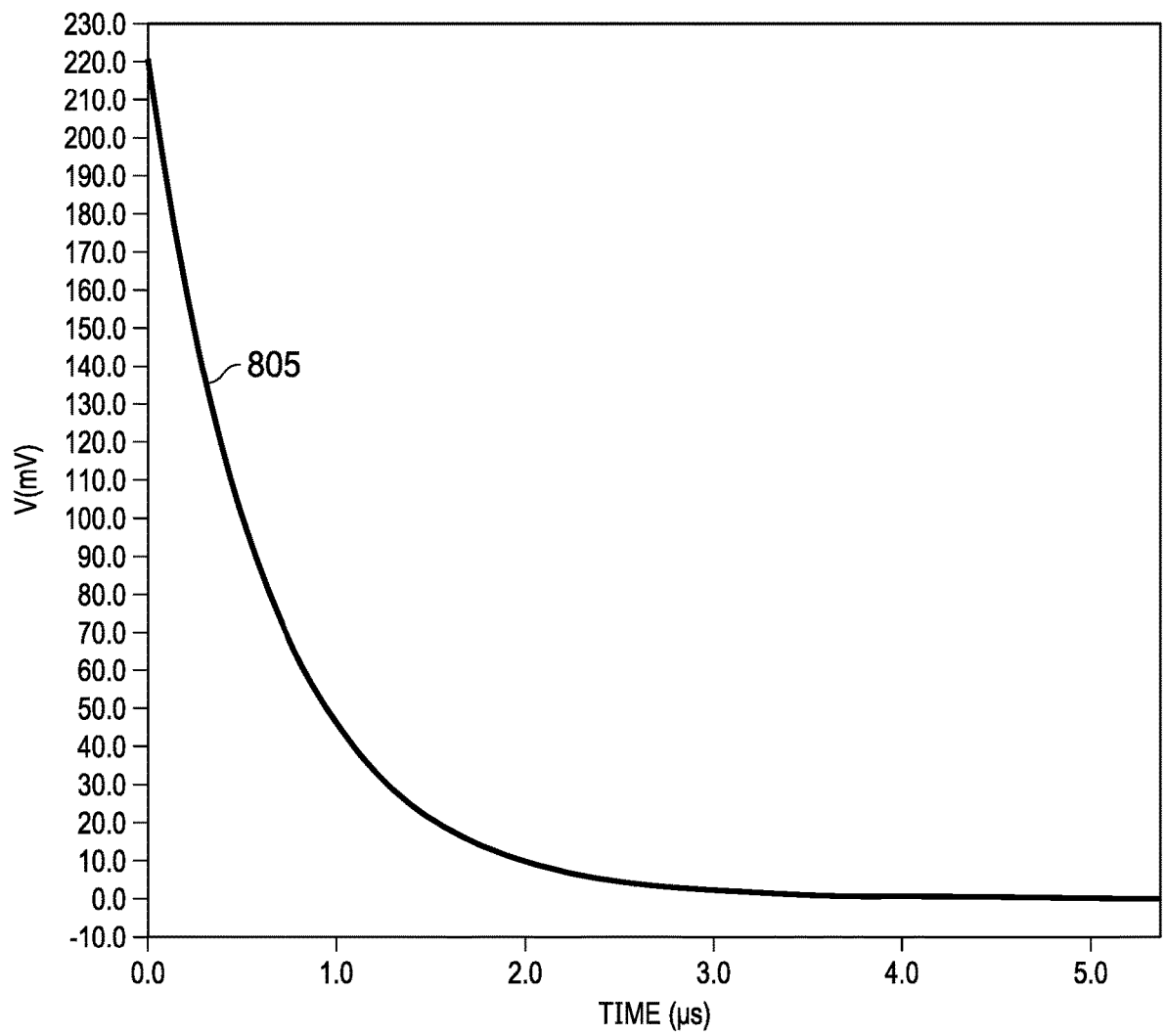

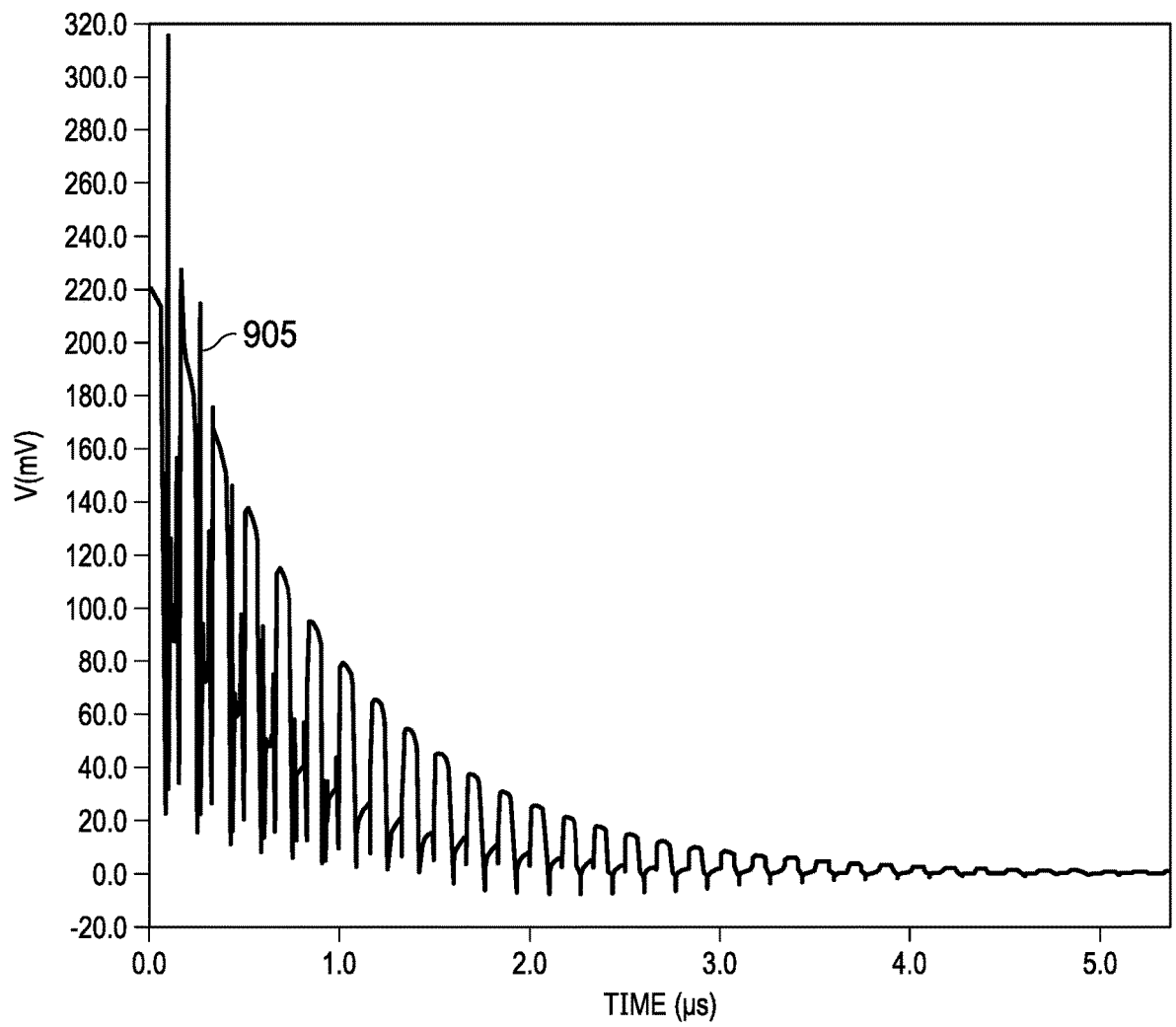

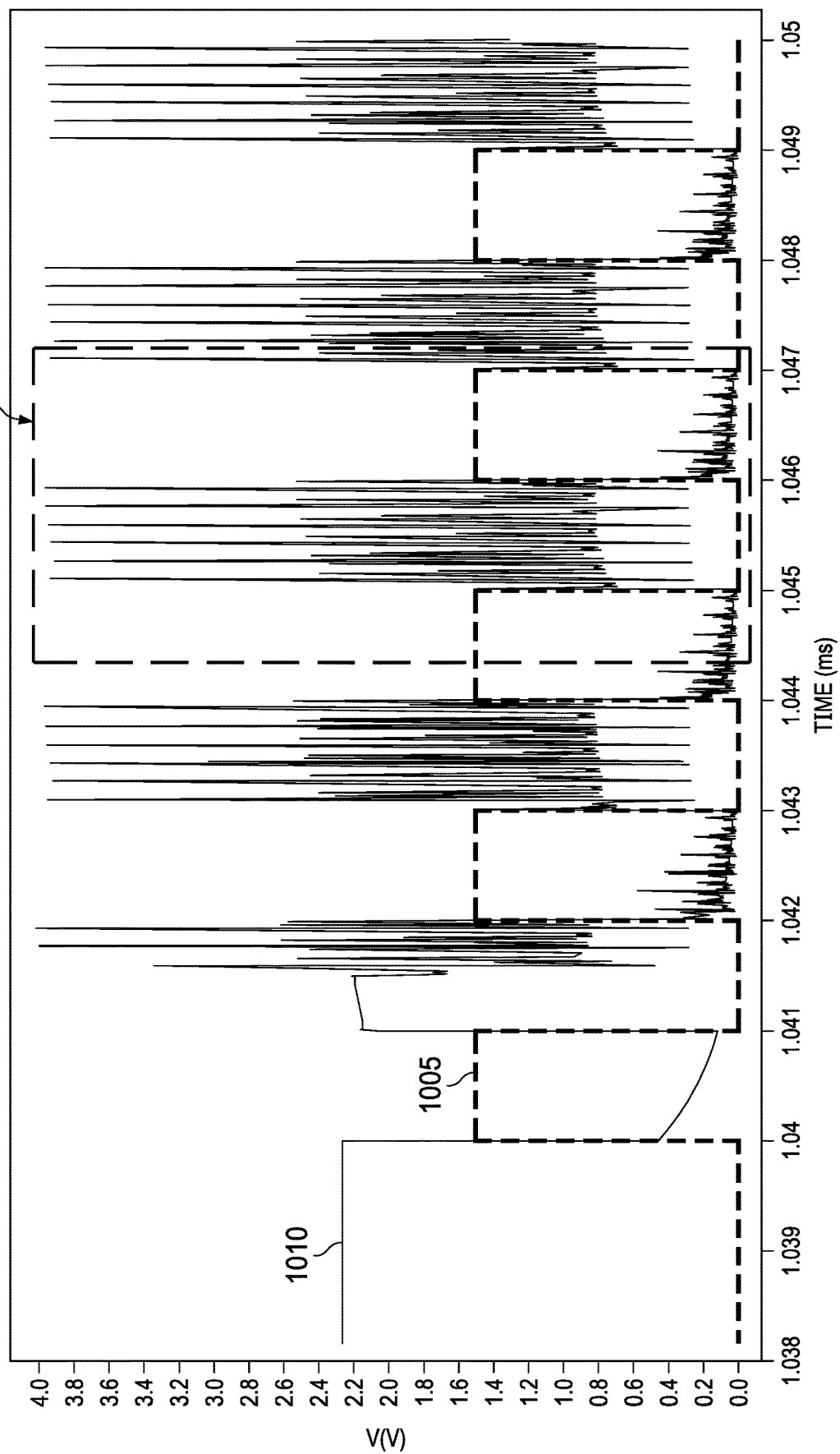

REDUCING NOISE EFFECTS IN ELECTROSTATIC DISCHARGE CIRCUITS

FIELD OF THE DISCLOSURE

Disclosed embodiments relate generally to the field of circuits. More particularly, and not by way of any limitation, the present disclosure is directed to reducing noise effects in electrostatic discharge circuits.

BACKGROUND

Certain low-side drivers and transceiver pins must be able to tolerate the high levels of noise picked up by the wiring harness that connects multiple transceivers in a large system such as an automobile. The electrostatic discharge (ESD) structures protecting these pins must be activated by certain very high speed voltage transients in order to protect the pins during ESD events. However, repeated smaller transients from noise can have a cumulative effect on these devices, causing partial turn-on and interfering with normal operations.

SUMMARY

The disclosed direct power injection (DPI) circuit distinguishes between ESD events that are extreme in nature but only occur a few at a time, and noise events that are milder but may be periodic in nature. The design includes a small charge-pump-like circuit that is capacitively coupled to the pin being protected. The circuit is tuned such that the output does not respond to one or more ESD events, but during a periodic stimulus such as noise or DPI testing, the voltage created on the charge pump rises and turns on the gate of an output transistor that is coupled between an output node of the circuit and a lower rail. The output node can be connected to the gate of an ESD power device such that a DPI event turns on the output transistor and pulls down on the gate of the ESD power device. By lowering the impedance to ground on the gate of the ESD power device, the DPI circuit prevents drain-gate coupling of the ESD power device from activating the ESD power device.

In one aspect, an example of a DPI circuit for reducing noise effects in ESD circuits coupled to a protected pin is disclosed. The circuit includes an output node for coupling to the gate of a complementary metal oxide silicon (CMOS) power device that is coupled to carry an electrostatic discharge (ESD) event on the protected pin to ground when turned ON; an input node for coupling to the protected pin; a first N-type metal oxide silicon (NMOS) transistor having a drain coupled to the output node, a source coupled to a lower rail and a gate; a charge pump circuit coupled between the input node and the gate of the first NMOS transistor; and a first resistor having a first terminal coupled to the gate of the first NMOS transistor and a second terminal coupled to the lower rail.

In another aspect, an example of a system on a chip (SOC) is disclosed. The SOC includes a driver coupled to provide an output signal on a protected pin; a complementary metal oxide silicon (CMOS) power device coupled between the protected pin and a lower rail and having a gate; and a direct power injection (DPI) circuit comprising: an output node coupled to the gate of the CMOS power device; an input node coupled to the protected pin; a first N-type metal oxide silicon (NMOS) transistor having a drain coupled to the output node, a source coupled to a lower rail and a gate; a charge pump circuit coupled between the input node and the gate of the first NMOS transistor; and a first resistor having a first terminal coupled to the gate of the first NMOS transistor and a second terminal coupled to the lower rail; and a second NMOS transistor having a drain coupled to the gate of the first NMOS transistor, a source coupled to the lower rail and a gate coupled to receive a disable signal.

In yet another aspect, an example of an SOC is disclosed. The SOC includes a transceiver driver coupled to provide differential output signals on a first protected pin and a second protected pin; a first electrostatic discharge (ESD) circuit coupled between the first protected pin and a lower rail; a second ESD circuit coupled between the second protected pin and the lower rail; and a direct power injection (DPI) circuit comprising: an output node coupled to the first and second ESD circuits; an input node coupled to the first protected pin and the second protected pin; a first NMOS transistor having a drain coupled to the output node, a source coupled to a lower rail and a third gate; a charge pump circuit coupled between the input node and the gate of the first NMOS transistor; and a first resistor having a first terminal coupled to the gate of the first NMOS transistor and a second terminal coupled to the lower rail.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 8A and 8B depict signals from system 600 when the ESD protection circuits are disconnected and DPI stimulus is provided;

FIGS. 9A and 9B depict signals from system 600 when the ESD protection circuits are connected but the DPI circuit is disabled and DPI stimulus is provided;

FIGS. 10A and 10B depict signals from system 600 when the ESD protection circuits are connected but the DPI circuit is disabled and DPI stimulus is provided.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
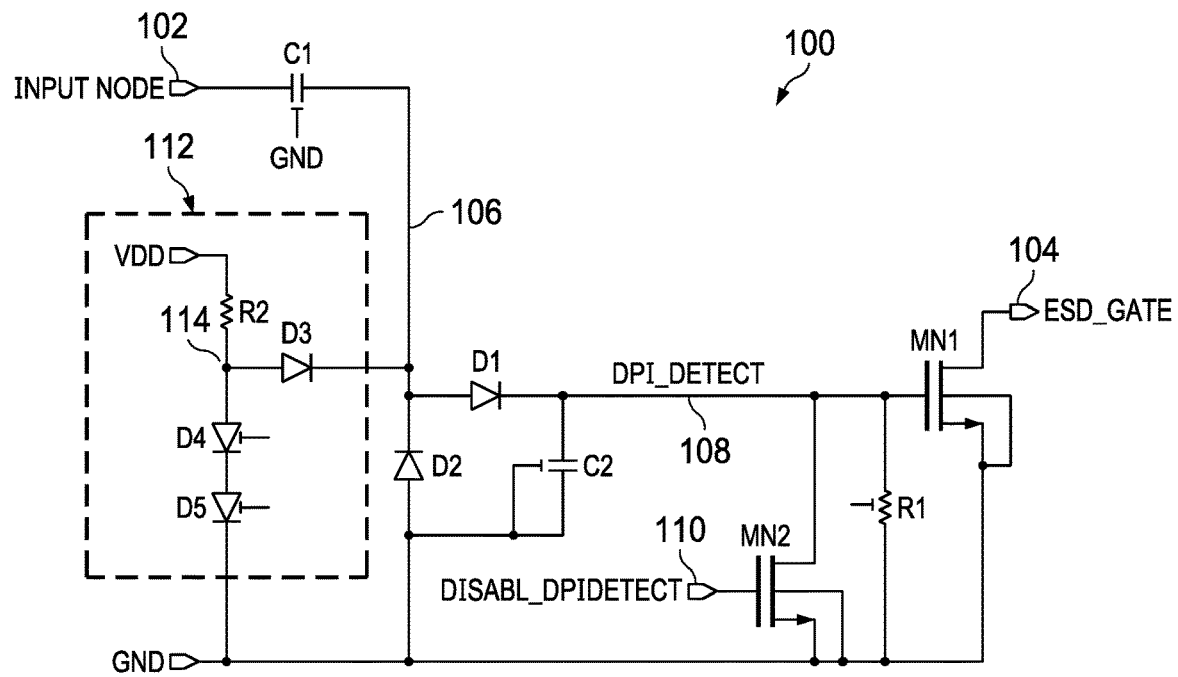
FIG. 1 depicts an schematic diagram of an example DPI circuit according to an embodiment of the disclosure.

FIG. 1 depicts a DPI circuit 100 according to an embodiment of the disclosure. DPI circuit 100 has at least four nodes or pins for coupling to power supplies and other circuits:

input node 102, which can be coupled to a pin, e.g., of a driver, which is to be protected from ESD events, an output node shown here as ESD_gate 104, which is to be coupled to the gate of an ESD power device, an optional upper rail, here VDD, and a lower rail, shown as ground (GND).

An N-type metal oxide silicon (NMOS) transistor MN1 is coupled between output node ESD_gate 104 and the lower rail, allowing the circuit to pull down the gate of the ESD power device when NMOS transistor MN1 is turned ON. Capacitor C1 has one terminal coupled to input node 102 and a second terminal coupled to the gate of NMOS transistor MN1 through diode D1. A second diode D2 is coupled between the lower rail and a point between the first capacitor and the first diode. A second capacitor C2 has a terminal coupled between diode D1 and the gate of NMOS transistor MN1 and a second terminal coupled to the lower rail. Although capacitor C2 is shown as a component, capacitor C2 may be either a specific component of the circuit or a parasitic capacitor created by the topology. Finally, a resistor R1 is coupled between the gate of NMOS transistor MN1 and the lower rail.

It will be recognized that the circuit formed by capacitor C1 and diodes D1 and D2 forms a charge pump. It is noted that this specific topology is provided as an example only and can be replaced by any other charge pump topology coupled between input node 102 and the gate of NMOS transistor MN1. When repeated oscillations are provided on input node 102, e.g., from noise on a protected pin, charge can be pulled toward node 106 from the lower rail through diode D2, but can only be pushed to DPI_detect node 108, effectively "pumping up" the charge on DPI_detect node 108. A charge on DPI_detect node 108 will be drained over time to the lower rail through resistor R1. By setting the values on capacitors C1, C2 and resistor R1, DPI circuit 100 can be customized for the needs of different scenarios by setting, e.g., the speed with which a charge is built up on DPI_detect node 108 and how quickly the charge is discharged. In one example embodiment, resistor R1 has a value of a few megaohms, capacitor C1 has a value of a few femtofarads, and capacitor C2 has a value of a few picofarads.

NMOS transistor MN2 is coupled between the gate of NMOS transistor MN1 and the lower rail in order to provide a means of disabling the DPI detection. The systems in which the disclosed circuit operates are generally tested for response to DPI events and NMOS transistor MN2 provides a means for that testing to compare operation with and without DPI protection by ensuring that no charge can build up on DPI_detect node 108. Accordingly, the gate of NMOS transistor MN2 receives a disable signal, disable_DPIdetect 110. In at least one embodiment, a regulator 112 provides a second power source to DPI circuit 100 in order to precharge the gate of NMOS transistor MN1. Regulator 112 includes a resistor R2 coupled in series with two diodes D4, D5 between the upper rail and the lower rail and provides a known voltage on node 114. Node 114 is coupled to node 106 through diode D3. Regulator 112 is optional and can be omitted, in which case DPI circuit 100 is entirely powered from input node 102. Regulator 112 can also be replaced by other regulator topologies as known in the art coupled to diode D3.

Figure 2:
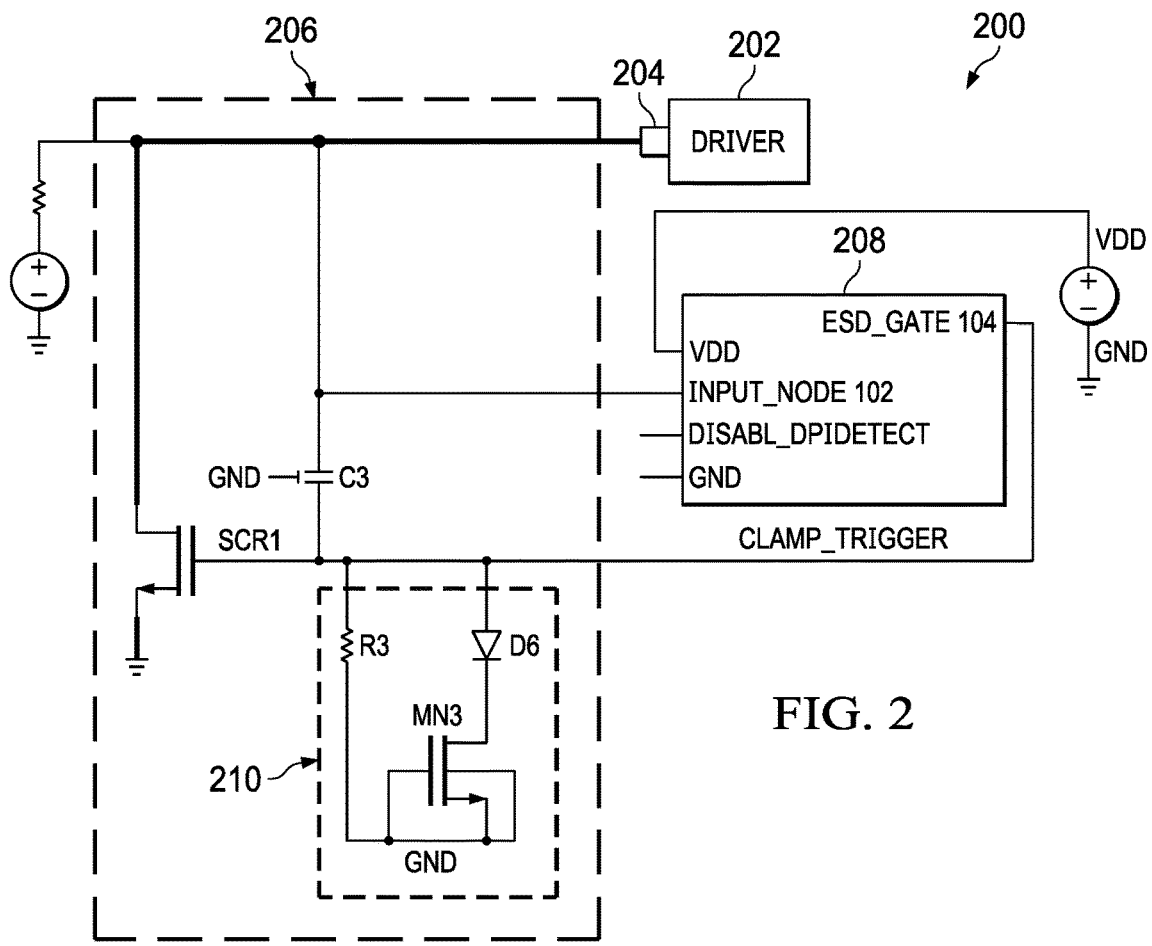
FIG. 2 depicts a schematic diagram of an example system containing an ESD power device and a DPI circuit according to an embodiment of the disclosure.

FIG. 2 depicts a schematic diagram of an example system 200 containing a driver 202 that has a pin 204 to be protected from ESD events, an ESD protection circuit 206 and a DPI circuit 208 according to an embodiment of the disclosure. In one embodiment, system 200 is provided as an SOC. Protected pin 204 can be coupled to one or more additional circuits, which are not specifically shown. Optimal ESD protection occurs when a very fast ramp-up of voltage occurs on protected pin 204, which is then dissipated by turn-on of a power device that quickly drains the charge to the lower rail. In this embodiment, the power device is a CMOS power device SCR1 that is coupled between the protected pin 204 and the lower rail. CMOS power device SCR1 can be any of a silicon controlled rectifier (SCR), an NMOS transistor, and a bipolar transistor.

The drain and gate of CMOS power device SCR1 are capacitively coupled to each other through capacitor C3, which can be either a specific component in the circuit or can be a parasitic capacitor created by the topology of the circuit. When an ESD event occurs on protected pin 204, the terminal of capacitor C3 that is coupled to protected pin 204 goes high, driving any charge on the opposite terminal of capacitor C3 towards the gate of CMOS power device SCR1 and turning ON CMOS power device SCR1. A circuit 210 is coupled to the gate of CMOS power device SCR1 to allow accumulated charge to drain to the lower rail. Circuit 210 includes a resistor R3 that is coupled between the gate of CMOS power device SCR1 and the lower rail and also includes NMOS transistor MN3, which has a drain coupled to the gate of CMOS power device SCR1 through diode D6 and both a source and gate coupled to the lower rail. Input node 102 of DPI circuit 208 is coupled to the protected pin 204 and receives the same signals as protected pin 204 while ESD_gate 104 of DPI circuit 208 is coupled to the gate of CMOS power device SCR1. As will be shown in the following figures, ESD events, even when they occur in series, do not affect the value on ESD_gate 104, but events such as noise will cause ESD_gate 104 to pull down on the gate of CMOS power device SCR1.

Figure 3A:
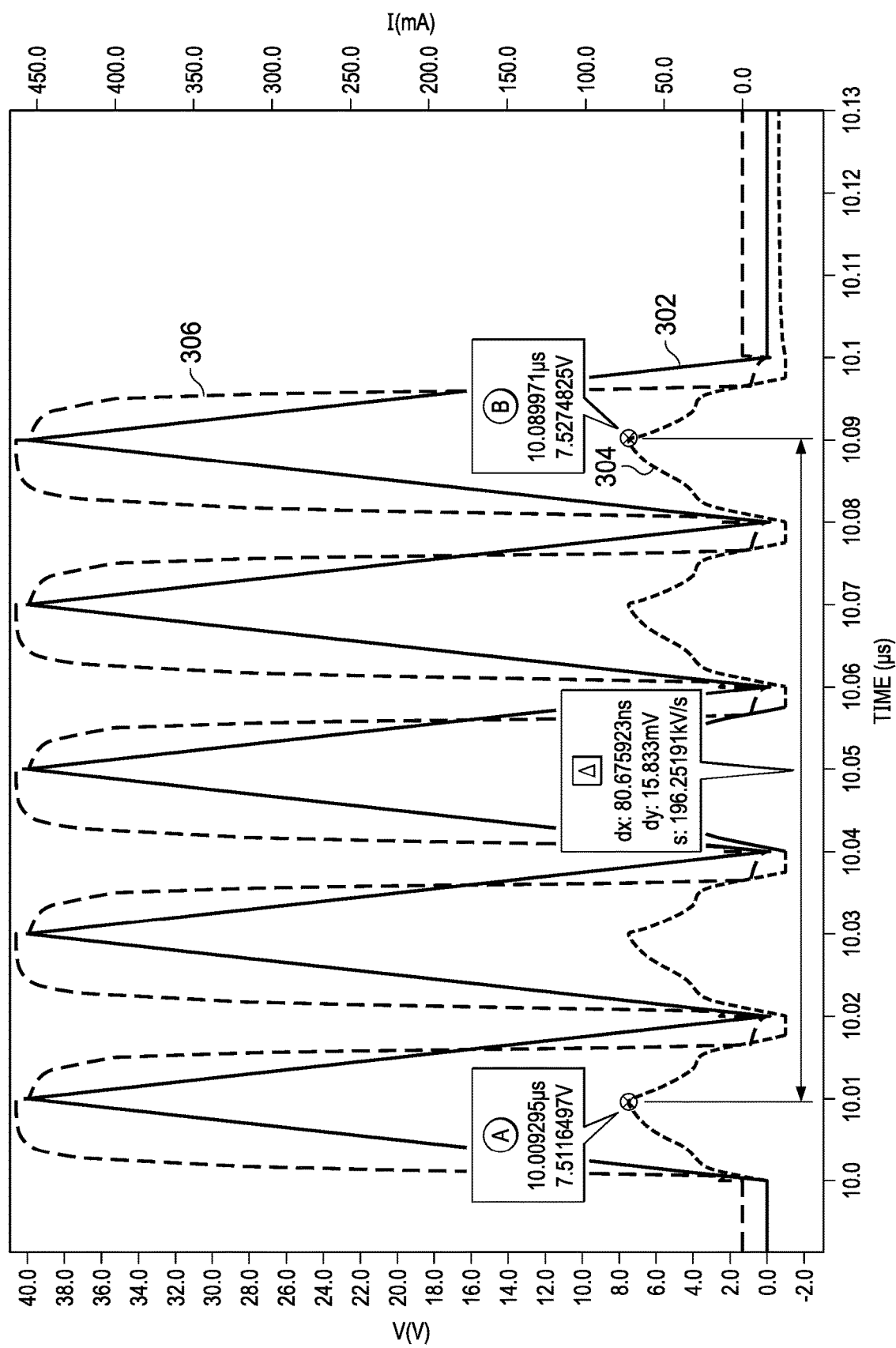
FIG. 3A depicts signal traces during an ESD simulation with the DPI detection of system 200 disabled.

FIG. 3A depicts signal traces during an ESD simulation on system 200 while the disclosed DPI detection is disabled. Three signals are shown: the signal 302 depicts the voltage on the pin, signal 304 depicts the voltage on the gate of CMOS power device SCR1, and the signal 306 depicts the current through the drain of CMOS power device SCR1, with the Y-axis for voltage shown on the left of the figure and the Y-axis for current shown on the right of the figure. In this simulation, a series of five high-speed pulses in signal 302 are provided to simulate multiple ESD events occurring together or the ringing that can sometimes occur after a single ESD event. Each of the five high-speed pulses peaks at a value near 40 volts and the five peaks occur over a period of about a tenth of a microsecond. During each ESD event, the charge on the gate of SCR1, as reflected in signal 304, also rises to a value of about 8 volts. This turns ON CMOS power device SCR1 and allows the charge to be drained to ground as reflected by signal 306, which rises quickly to a value of about 450 mA, then drops quickly as the voltage decreases. This is a desired response during ESD events, so the activation of DPI circuit 100 should not disrupt this response.

Figure 3B:
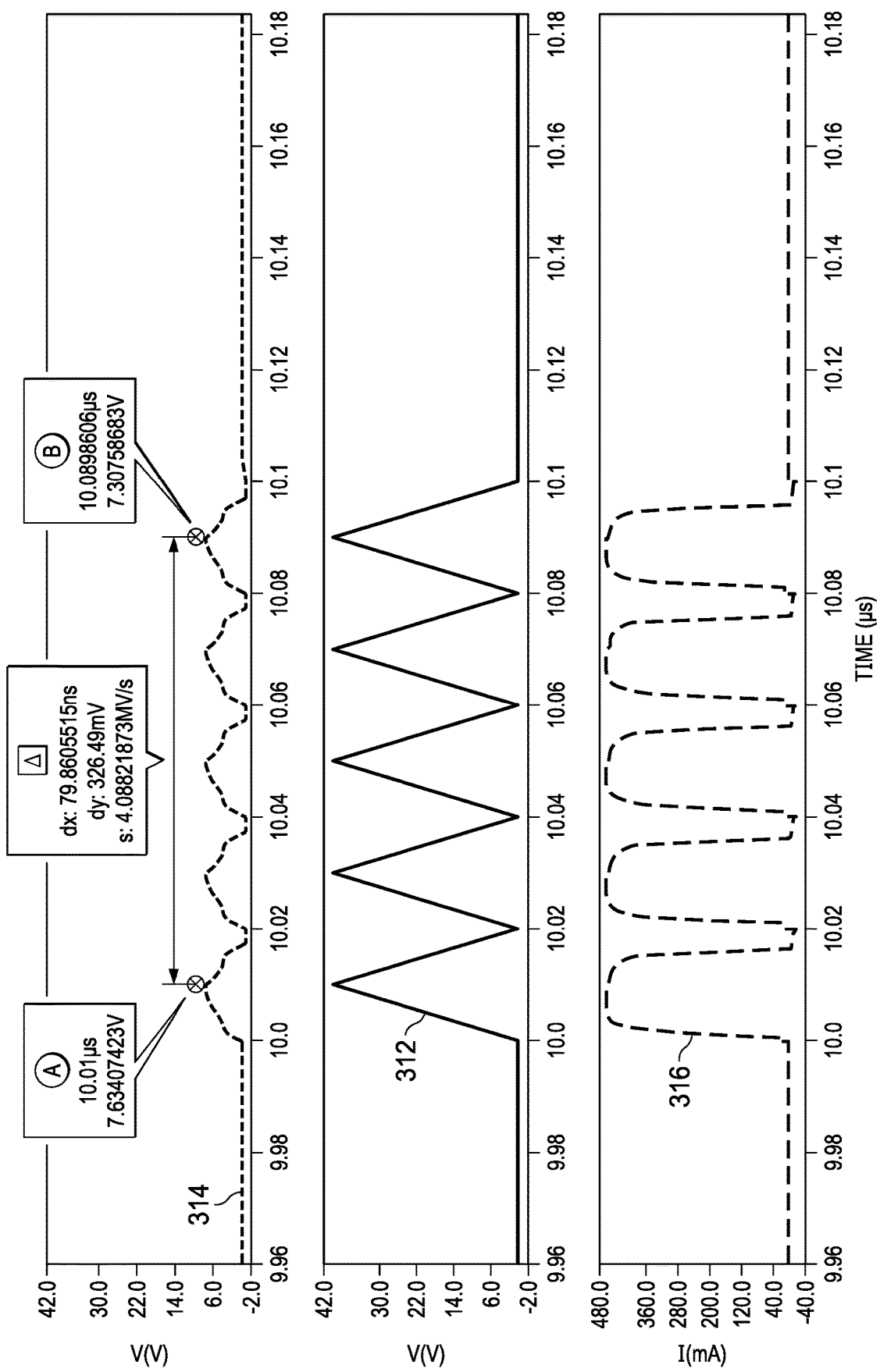
FIG. 3B depicts signal traces during an ESD simulation with the DPI detection of system 200 enabled.

FIG. 3B depicts signal traces during a ESD simulation on system 200 with the disclosed DPI detection enabled. In this figure, the three signals, i.e., signal 312 depicting voltage on the pin, signal 314 depicting voltage on the gate of the CMOS power device SCR1, and signal 316 depicting current through the drain of the CMOS power device SCR1, are shown separately. It can be seen by comparing the two figures that the signals are essentially unchanged by the activation of DPI circuit 208, which is the desired response.

Figure 4A:
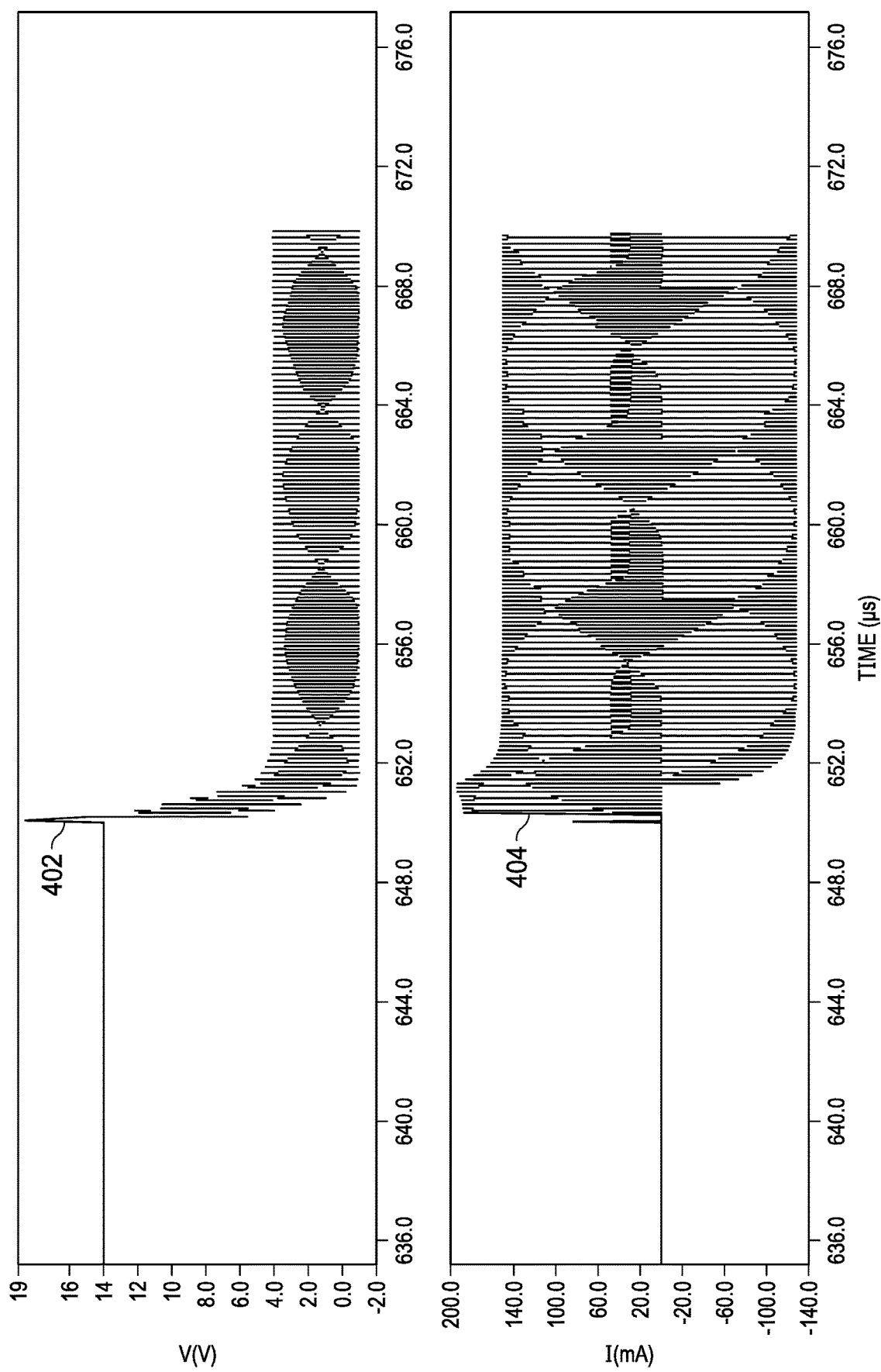
FIG. 4A depicts signal traces during a DPI simulation with the DPI detection of system 200 disabled.

The next simulation shown is for direct power injection, which emulates automotive system noise by providing a fast oscillating signal on the protected pin 204. In one embodiment, when noise is present on protected pin 204, driver 202 utilizes the average value on protected pin 204. This means that the signal can oscillate without causing problems, as long as the oscillations center around the original signal value. FIG. 4A depicts two signals during testing when DPI circuit 100 is disabled. Signal 402 depicts the voltage on protected pin 204 and signal 404 depicts the current through CMOS power device SCR1 during testing when DPI detection circuit 100 is disabled. In this figure, signal 402 initially has a voltage of about 14 volts; when the DPI testing begins sending a quickly oscillating signal, voltage 402 briefly peaks at about 19 volts, but as the oscillations continue, signal 402 oscillates between 0 and 4 volts, providing an average value on the pin of about 2 volts. This lowered voltage causes CMOS power device SCR1 to become low impedance, resulting in the current reflected by signal 404, which oscillates between about 140 mA and −120 mA, so that the average value of signal 404 is no longer centered around the transmitted value of zero volts. This current, which results from the capacitive coupling between the drain and gate of CMOS power device SCR1, is the problem addressed by the presently disclosed DPI circuit.

Figure 4B:
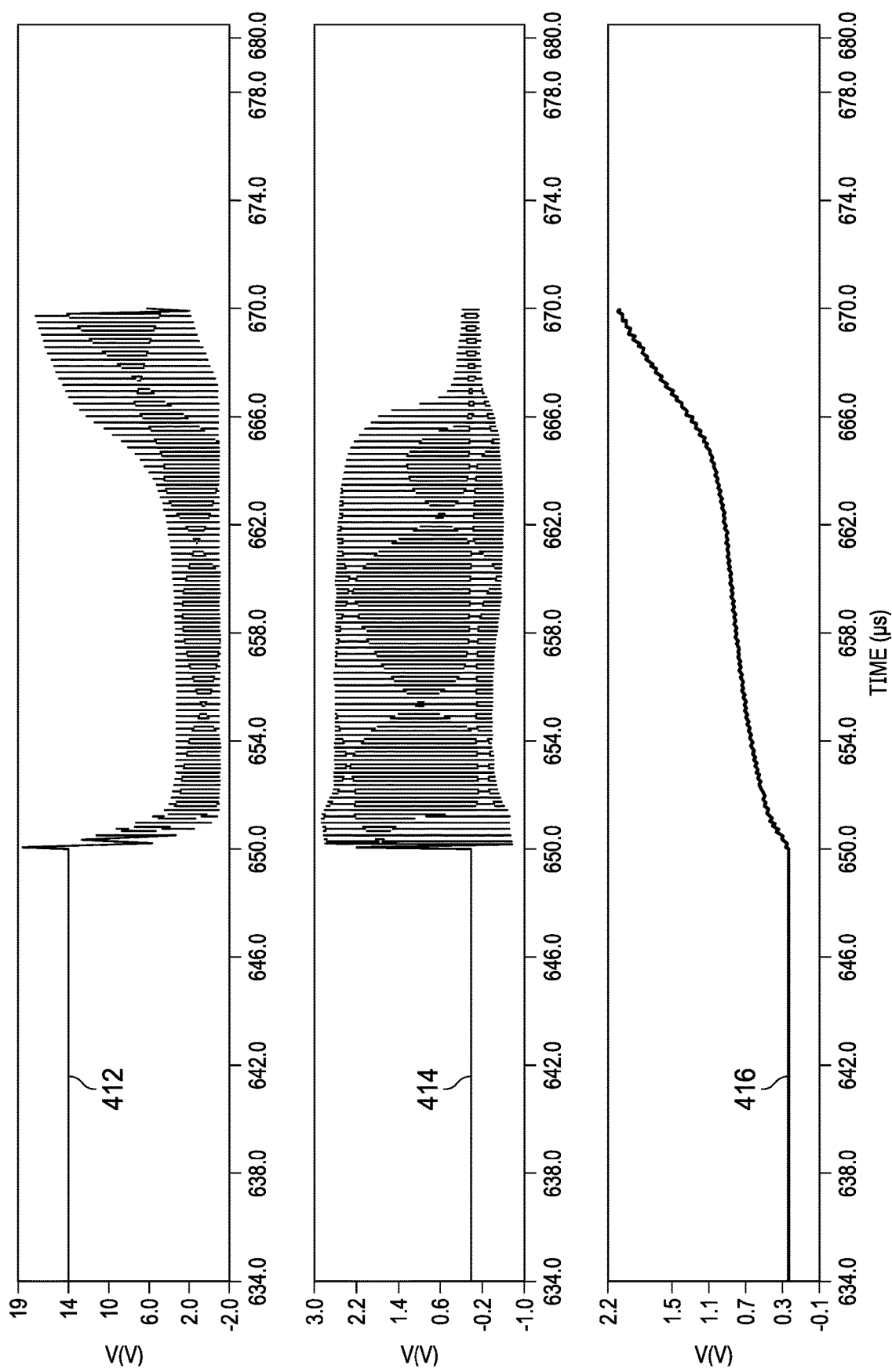
FIG. 4B depicts signal traces during a DPI simulation with the DPI detection of system 200 enabled.

FIG. 4B depicts the same three signals when DPI circuit 100 is enabled. Signal 412 depicts the voltage on pin 204, signal 414 depicts the voltage on the gate of CMOS power device SCR1, and signal 416 depicts the voltage on the gate of NMOS transistor MN1 of DPI circuit 100, i.e., DPI_detect 108, when DPI detection circuit 100 is enabled. As in the previous simulation signal 412 on the pin 204 moves from an initial voltage of about 14 volts to an oscillating voltage that peaks before settling to oscillate between 0 and 4 volts. As the noise occurs, signal 414 quickly moves to oscillate between about 2.8 volts and −0.5 volts, causing CMOS power device SCR1 to conduct a current. However, while these oscillations are occurring, the voltage on signal 416 (DPI_detect) is increasing. After a period of time, which can be determined by the values of capacitors C1, C2 and resistor R1, signal 416 exceeds the threshold voltage for NMOS transistor MN1, turning NMOS transistor MN1 ON. When this occurs, the oscillations in signal 414 decrease until the oscillations center around zero and the oscillations on signal 412 increase. In the embodiment shown, NMOS transistor MN1 turns ON after about 15 microseconds, after which the oscillations on signal 414 decrease until they remain between about 0.2 and −0.2 volts.

Figure 5:
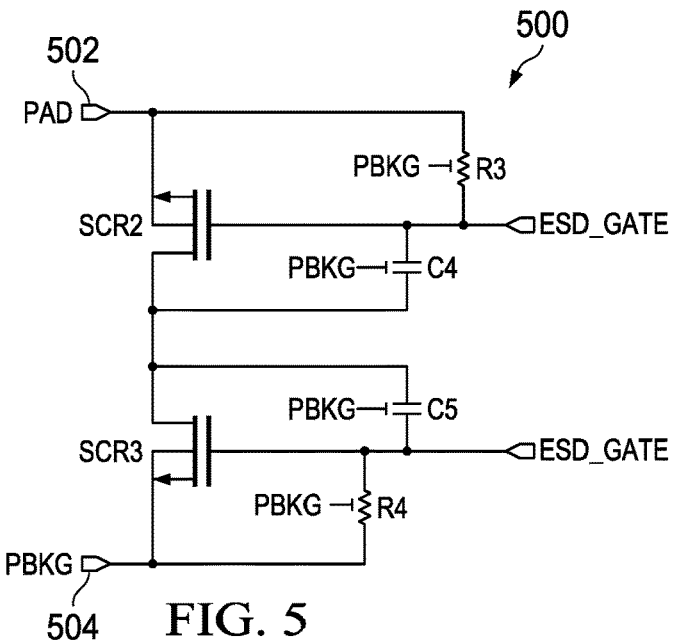
FIG. 5 depicts a schematic diagram of an ESD circuit to which the disclosed DPI circuit can be coupled.

FIG. 5 depicts an alternative ESD circuit 500 with which the disclosed DPI circuit 100 can operate. ESD circuit 500 is bi-directional, with noise being introduced at either of pad 502 or PBKG 504. Two CMOS power devices SCR2, SCR3 are coupled in series between pad 502 and PBKG 504. As in the previous example CMOS power devices SCR2, SCR3 can be any of an SCR, an NMOS transistor, and a bipolar transistor. The gate of CMOS power device SCR2 is coupled to pad 502 through resistor R4, to a point between CMOS power devices SCR2, SCR3 through capacitor C4, and to ESD_gate of DPI circuit 100. Similarly, the gate of ESD power device SCR3 is coupled to PBKG 504 through resistor R5, to a point between CMOS power devices SCR2, SCR3 through capacitor C5, and to ESD_gate of DPI circuit 100. As in the previous circuits, capacitors C4 and C5 can be either a specific component of the circuit or a parasitic capacitor created by the topology.

Figure 6:
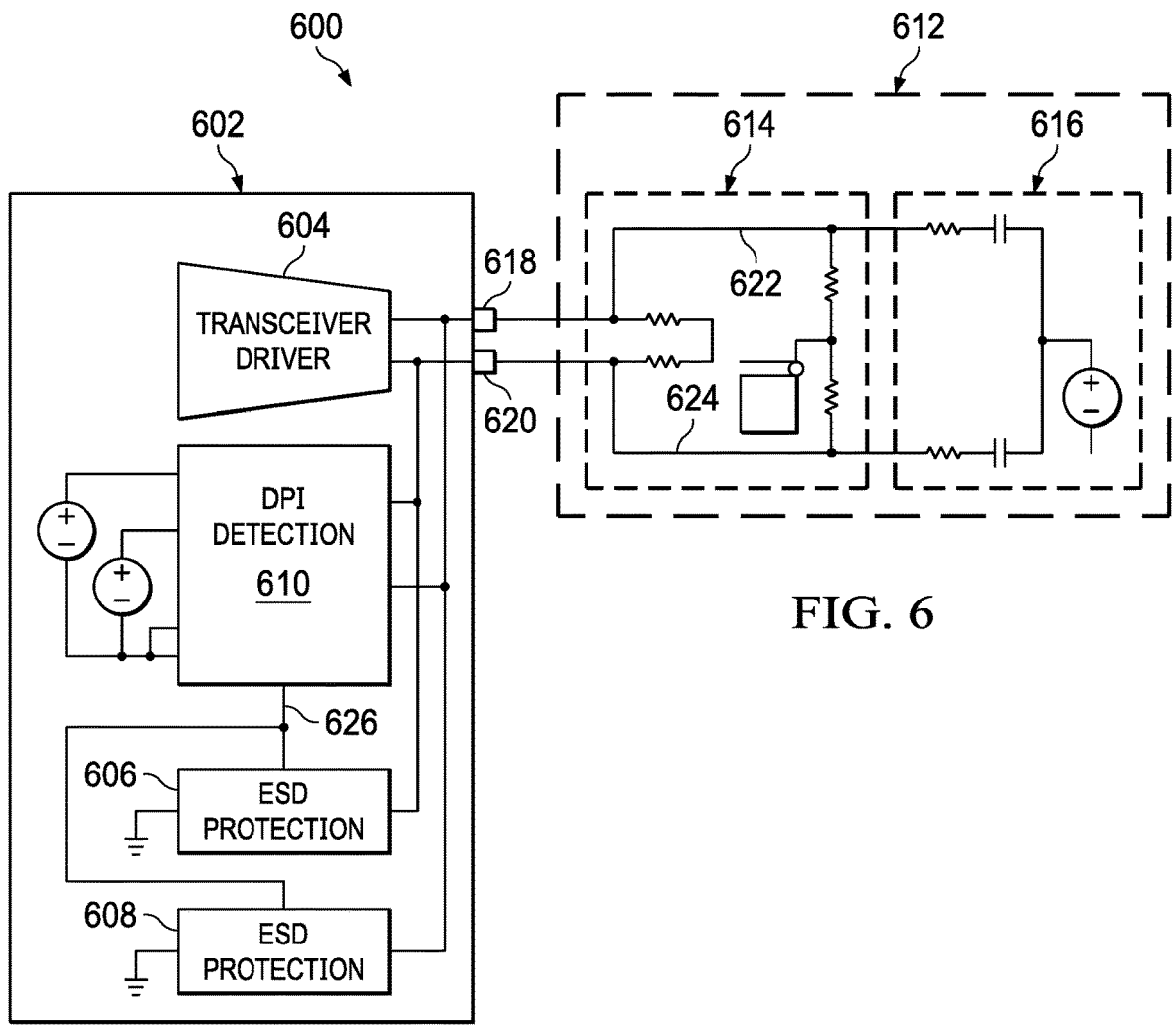
FIG. 6 depicts a schematic diagram of a system in which an SOC according to an embodiment of the disclosure is coupled to a bus and noise injection model.

FIG. 6 depicts a system 600 in which an SOC 602 includes a transceiver driver 604, ESD protection circuits 606, 608 and DPI detection circuit 610. SOC 602 is shown coupled to a circuit 612 that represents a combination of a bus 614 for an automotive system and a portion of an industry-standard noise injection model 616. Circuit 612 receives a differential signal on high signal line 622, which is coupled to pin 618 and on low signal line 624, which is coupled to pin 620. Transceiver driver 604 can be the driver for a controller access network (CAN), engine controller unit (ECU), local interconnect (LIN), or any other type of bus system for which the disclosed ESD and DPI protection is desired. Each of ESD protection circuits 606, 608 contains a copy of ESD circuit 500, with a respective pad 502 coupled to a one of pins 618, 620 and a respective PBKG node 504 coupled to a lower rail. In the embodiment shown, ESD protection circuit 606 is coupled to pin 620 and ESD protection circuit 608 is coupled to pin 618. DPI detection circuit 610 is coupled to both pin 618 and pin 620 such that noise on both of these pins is detected by this single circuit; DPI detection circuit 610 then provides output signal ESD_gate 626 to both ESD protection circuits 606, 608. In an alternate embodiment, not specifically shown, a separate DPI detection circuit can be provided to monitor each of pin 618 and pin 620. The following figures illustrate the results of various simulations of testing on system 600.

Figure 7:
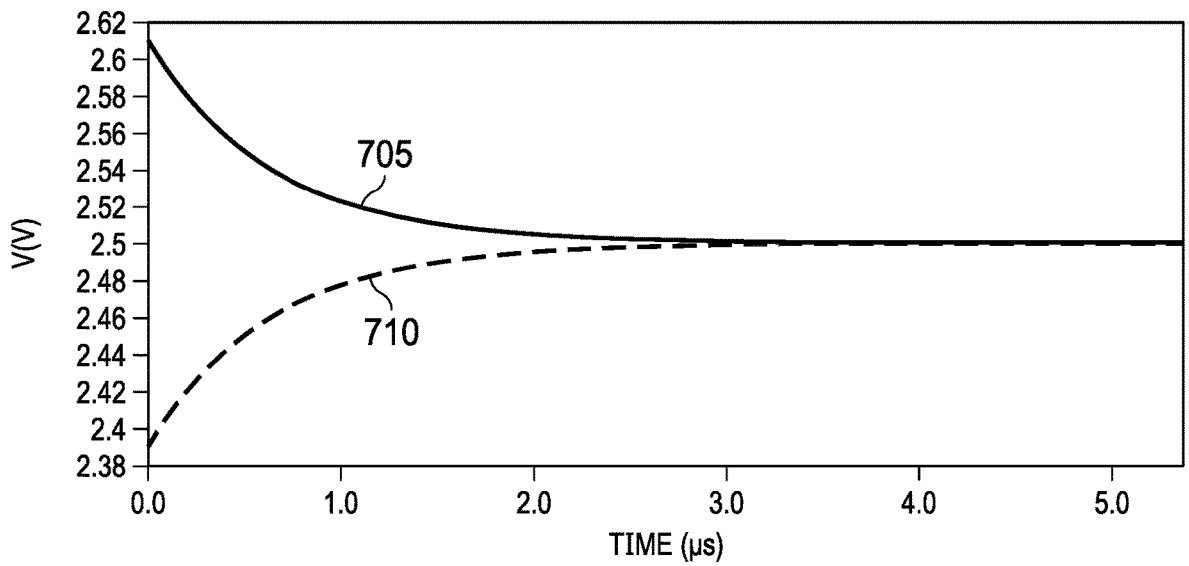
FIG. 7 depicts signals from system 600 when the ESD protection circuits are disconnected.
Figure 7:
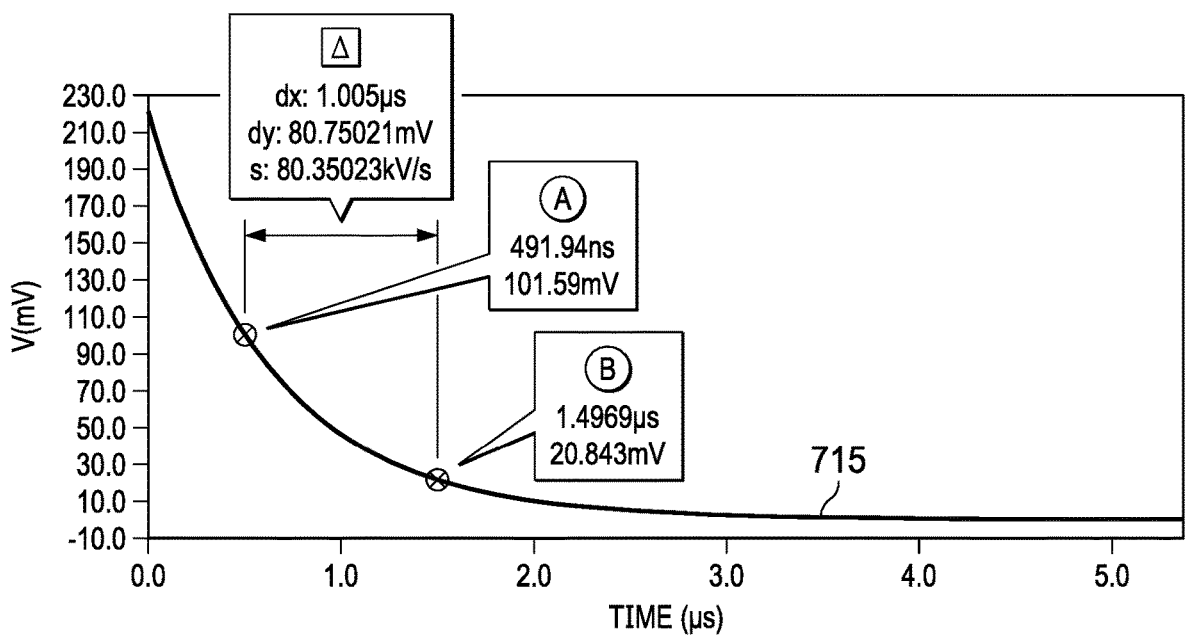

FIG. 7 depicts three signals taken from system 600 while the ESD protection circuits 606, 608 are disconnected from the bus and without any DPI stimulus. In the top half of the figure, high signal 705 is taken from high signal line 622 and low signal 710 is taken from low signal line 624 as these two signals demonstrate a symmetrical discharge to GND. In the bottom half of the figure, differential signal 715 is the differential value between high signal 705 and low signal 710, which also shows a smooth drop to zero. When the same symmetrical discharge is performed while ESD protection circuits 606, 608 are connected to the bus but no DPI stimulus is provided, the results are essentially the same, i.e., there is no observed impact from the presence of the ESD circuits when no DPI stimulus is present.

Figure 8B:
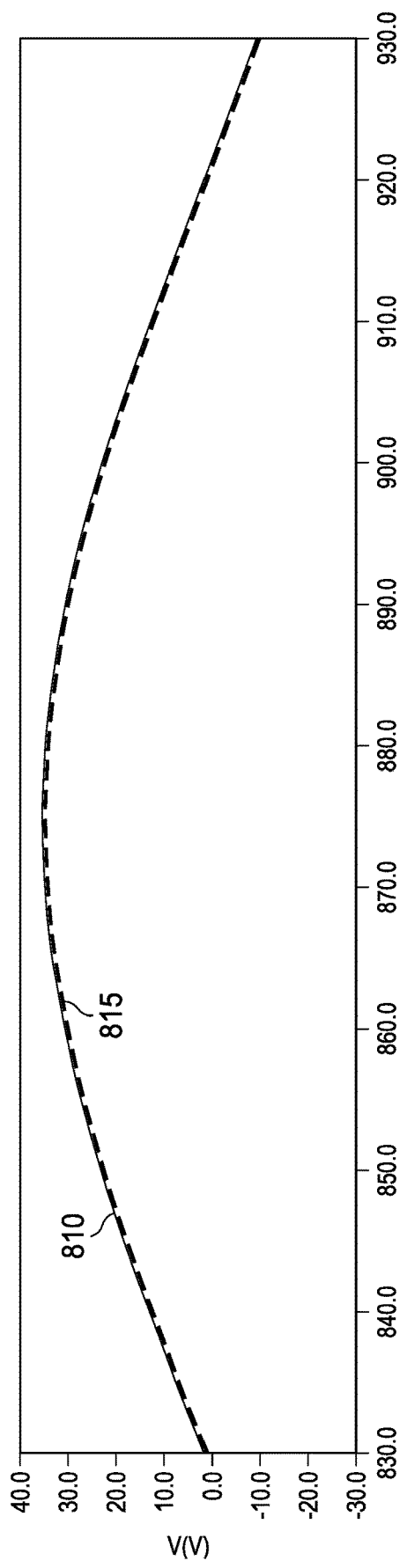

FIGS. 8A and 8B depict signals taken from system 600 with ESD protection circuits 606, 608 disconnected in system 600 while DPI stimulus is applied. FIG. 8A depicts only differential signal 805 as high signal line 622 and low signal line 624 discharge symmetrically to GND, which again drops smoothly during DPI stimulus. In FIG. 8B, a transient voltage is provided on high signal line 622 to provide signal 810 and on low signal line 624 to provide differential signal 815, which track each other very closely. Differential signal 815 remains flat at about 60 mV, demonstrating only small variations between the two signals. Since the data values carried on the bus depend on the difference between the high signal and the low signal, this close tracking in response to DPI stimulus is a desirable result.

Figure 9B:
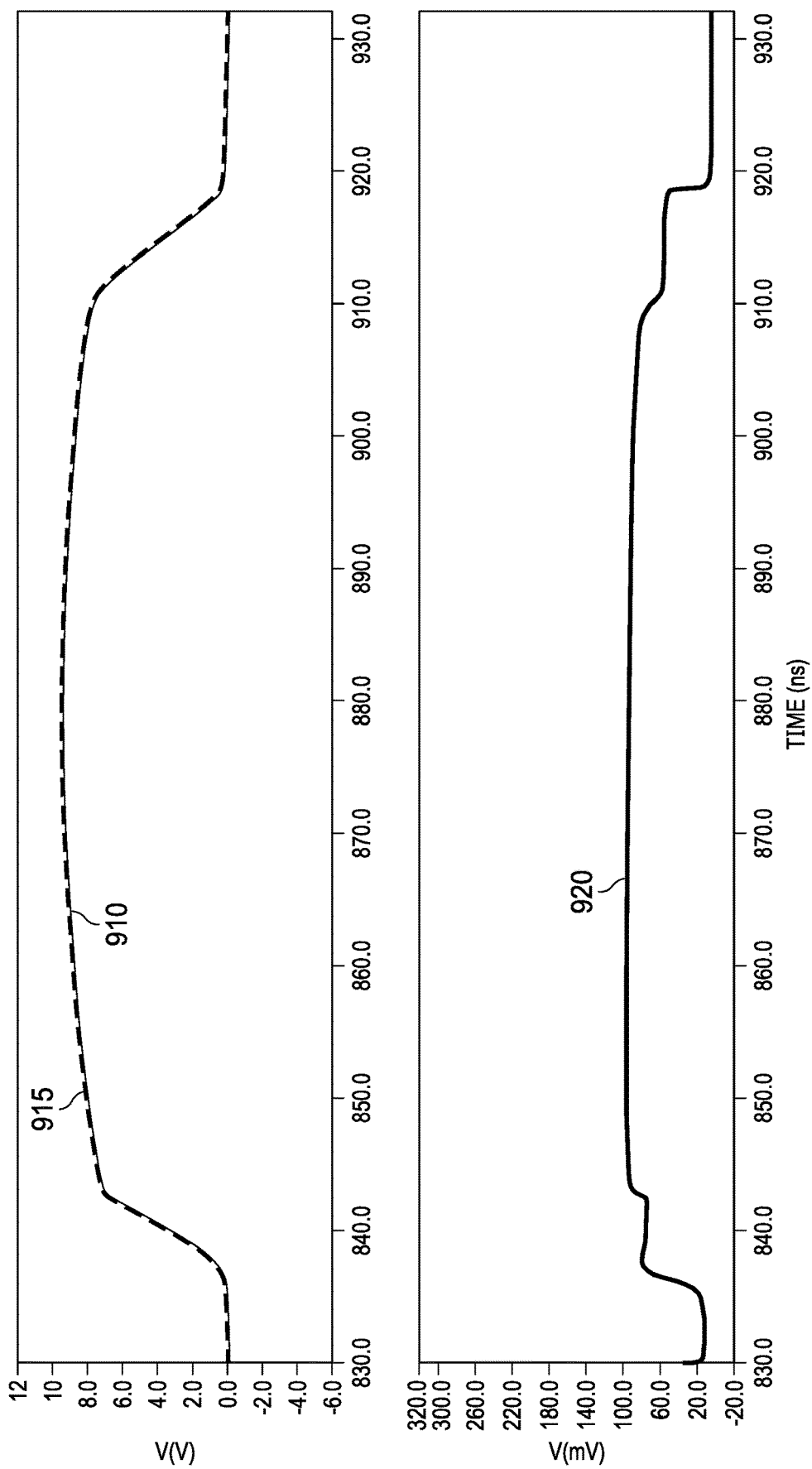

FIGS. 9A and 9B demonstrate the problem to which the disclosed DPI circuit is directed and depict signals taken from system 600 with ESD protection circuits 606, 608 connected but with DPI detection disabled while DPI stimulus is applied. In FIG. 9A, as high signal line 622 and low signal line 624 discharge to GND, differential signal 905 depicts large swings, which is a cause for concern. Then in FIG. 9B, a transient voltage is introduced that varies from zero to less than ten volts, producing low signal 910 and high signal 915. Differential signal 920 shows a variation between the two signals 910, 915 that varies from about 15 to 100 millivolts. As will be seen in the following figures, this amount of variation can cause errors in the detection of signals.

Figure 10B:
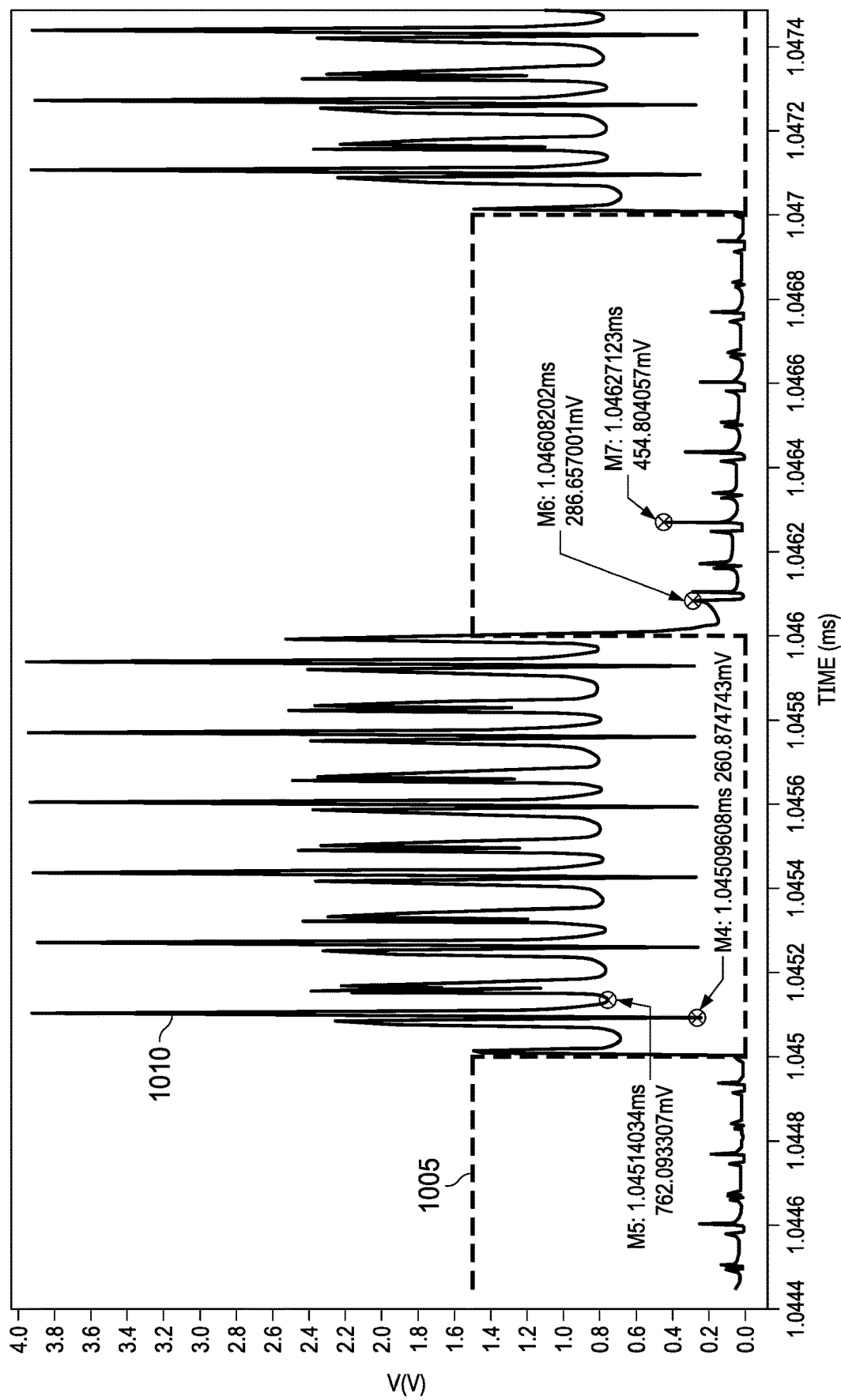

FIG. 10A depicts a transmitted signal 1005 and the received differential signal 1010 from system 600 when the ESD protection circuits 606, 608 were connected and DPI detection was disabled while DPI stimulus was applied. A portion of the signals enclosed by box 1015 are enlarged and reproduced in FIG. 10B. During a transmitted low value on signal 1005, received differential signal 1010 swings wildly, achieving in one test low values as low as 260.87 mV. During a transmitted high value on signal 1005, the variations in received differential signal 1010 achieve high values as high as 454.80 mV. Clearly these results can greatly interfere with signal interpretation.

Figure 11A:
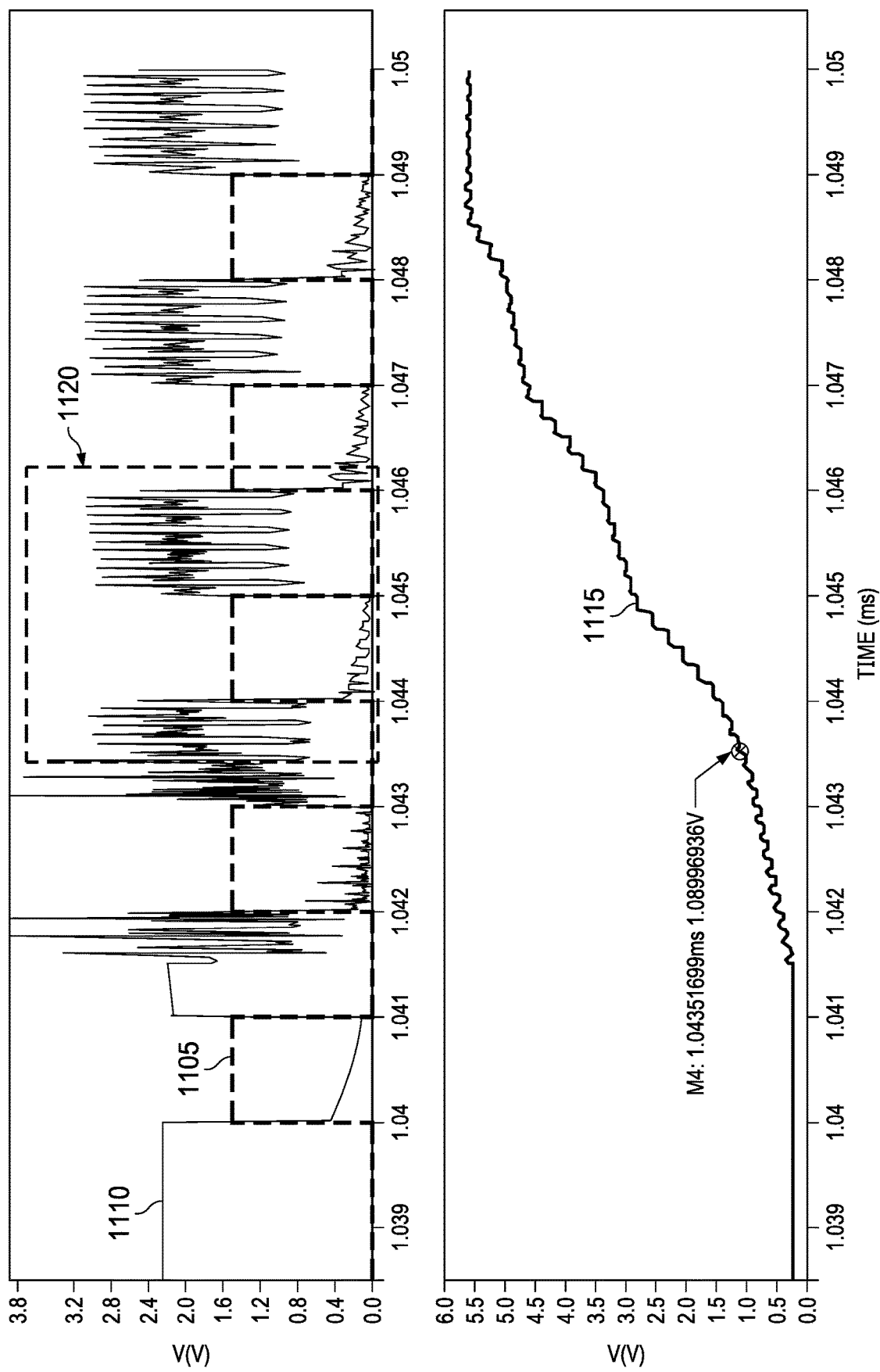
FIGS. 11A and 11B depict signals from system 600 when the ESD protection circuits and DPI circuit are connected and DPI stimulus is provided.
Figure 11B:
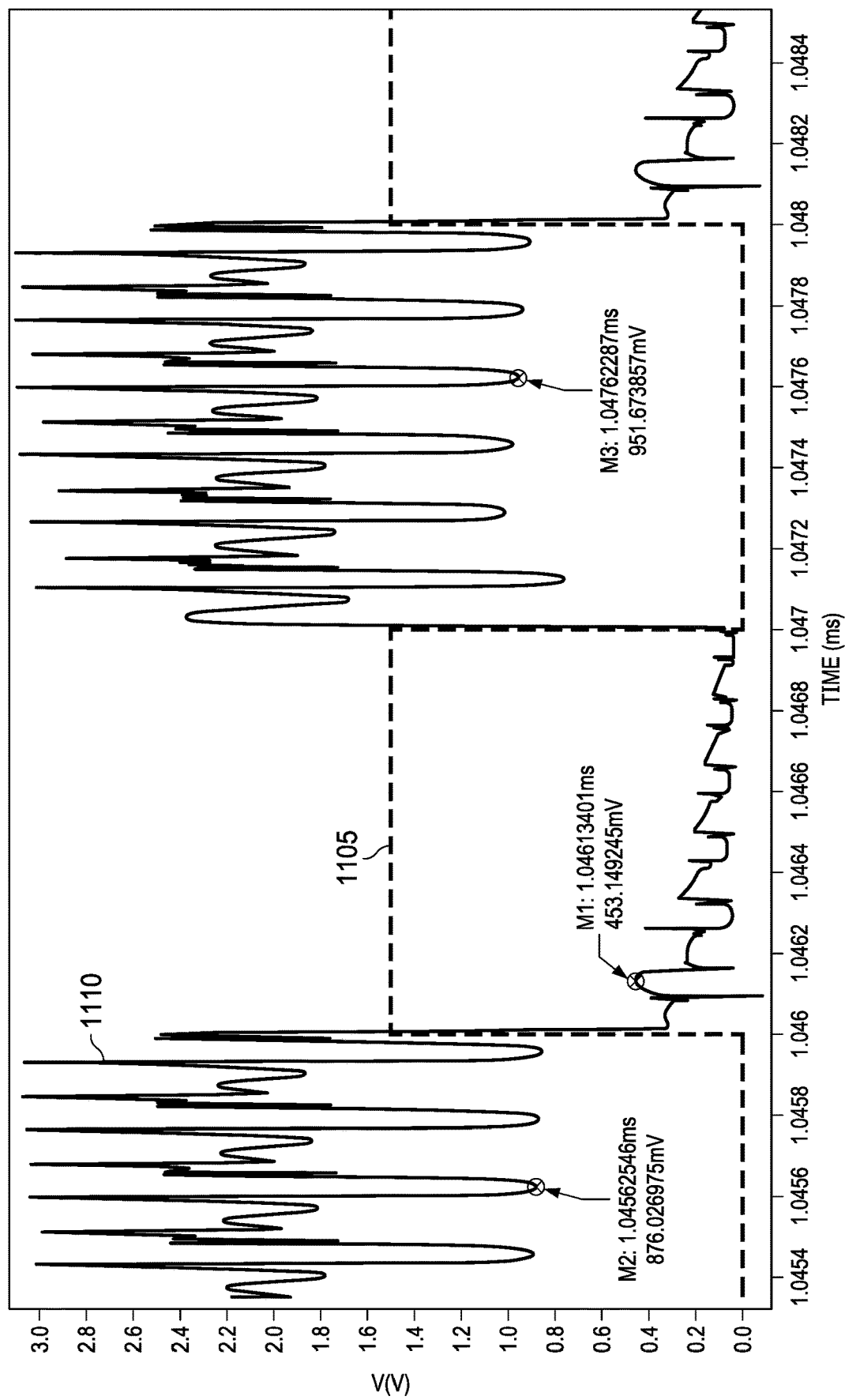

FIG. 11A depicts a transmitted signal 1105 and the received differential signal 1110 on system 600 when the ESD protection circuits 606, 608 are engaged and DPI detection in DPI circuit 610 is enabled while DPI stimulus was applied. Also shown is the DPI_detect signal 1115, which will trigger the pull-down of ESD power devices SCR2, SCR3 in each of ESD protection circuits 606, 608 in system 600. On the far left side of the figure transmitted signal 1105 and received differential signal 1110 do not reflect any noise and demonstrate a smooth transition between low and high values. When noise is introduced in system 600, received differential signal 1110 begins to oscillate wildly as in the previous example and the value of DPI_detect signal 1115 begins to rise. Once the voltage on DPI_detect signal 1115 rises far enough to turn ON NMOS transistor MN1, the gates of CMOS power devices SCR2, SCR3 in both of ESD protection circuits 606, 608 are pulled toward the lower rail. Box 1120 encloses a section of transmitted signal 1105 and received differential signal 1110 once NMOS transistor MN1 is turned ON; the signals enclosed by box 1120 are enlarged and reproduced in FIG. 11B. During a high value on transmitted signal 1105, the highest values received on received differential signal 1110 was 453.05 mV, a small improvement. During a low value on transmitted signal 1105, the lowest value on received differential signal 1110 was 876.42 mV, a significant improvement that reduces the effect of the noise on the results.

The disclosed DPI circuit acts like a charge pump and is coupled between a protected pin and the gate of an associated ESD device. The DPI circuit does not interfere with gate turn-on of the ESD device during ESD transients, but provides suppression of the capacitive response on the gate of the ESD device during repeated oscillations of the pin, reducing the effect of noise on the bus.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A direct power injection (DPI) circuit for reducing noise effects in an electrostatic discharge (ESD) circuit coupled to a protected node, the DPI circuit comprising:
   an output node adapted to be coupled to a gate of a power transistor that is coupled between the protected node and a ground;
   an input node adapted to be coupled to the protected node, the protected node receiving ESD events that turn on the power transistor and receiving smaller, cumulative, oscillating voltage noise effects that can cause the power transistor to turn on;
   a first transistor having a drain coupled to the output node, a source coupled to the ground, and a gate;
   a charge accumulation circuit connected between the input node and the gate of the first transistor, the charge accumulation circuit including:
      a first capacitor having a first terminal connected to the input node and having a second terminal connected to an intermediate node;
      a first diode having an anode connected to the intermediate node and having a cathode connected to the gate of the first transistor;
      a second diode having a cathode connected to the intermediate node and having an anode connected to the ground; and
      a second capacitor having a first terminal connected to the gate of the first transistor and having a second terminal connected to the ground; and
   a first resistor having a first terminal coupled to the gate of the first transistor and a second terminal coupled to the ground;
   the first capacitor, the second capacitor, and the resistor being tuned in response to the cumulative, oscillating voltage noise effects to build up charge on the gate of the first transistor to turn on the first transistor and turn off the power transistor.

2. The DPI circuit as recited in claim 1 in which:
the first terminal of the first capacitor is directly connected to the input node and the second terminal is directly connected to the intermediate node;
the anode of the first diode is directly connected to the intermediate node and the cathode of the first diode is directly connected to the gate of the first transistor; and
the cathode of the second diode is directly connected to the intermediate node and the anode of the second diode is directly connected to the ground.

3. The DPI circuit as recited in claim 1 in which the first terminal of the second capacitor is directly connected to the gate of the first transistor and the second terminal of the second capacitor is directly connected to the ground.

4. The DPI circuit as recited in claim 1 including:
a second transistor having a drain coupled to the gate of the first transistor, a source coupled to the ground, and a gate coupled to a disable input.

5. The DPI circuit as recited in claim 4 including:
a regulator coupled to provide a selected voltage on a given node; and
a third diode having a first terminal coupled to the given node and a second terminal coupled to the intermediate node.

6. The DPI circuit as recited in claim 5 in which the regulator includes a second resistor coupled in series with a fourth diode and a fifth diode between a power input and ground.

7. A system on a chip (SOC) comprising:
a driver coupled to provide an output signal on a protected pin;
a power transistor coupled between the protected pin and a ground and having a gate, the protected pin receiving ESD events that turn on the power transistor and receiving smaller, cumulative, oscillating voltage noise effects that can cause the power transistor to turn on; and
a direct power injection (DPI) circuit including:
an output node coupled to the gate of the power transistor;
an input node coupled to the protected pin;
a first transistor having a drain coupled to the output node, a source coupled to the ground, and a gate;
a charge accumulation circuit connected between the input node and the gate of the first transistor, the charge accumulation circuit including:
a first capacitor having a first terminal connected to the input node and having a second terminal connected to an intermediate node;
a first diode having an anode connected to the intermediate node and having a cathode connected to the gate of the first transistor;
a second diode having a cathode connected to the intermediate node and having an anode connected to the ground; and
a second capacitor having a first terminal connected to the gate of the first transistor and having a second terminal connected to the ground; and
a first resistor having a first terminal coupled to the gate of the first transistor and a second terminal coupled to the ground;
the first capacitor, the second capacitor, and the resistor being tuned in response to the cumulative, oscillating voltage noise effects to build up charge on the gate of the first transistor to turn on the first transistor and turn off the power transistor.

8. The SOC as recited in claim 7 in which:
the first terminal of the first capacitor is directly connected to the input node and the second terminal is directly connected to the intermediate node;
the anode of the first diode is directly connected to the intermediate node and the cathode of the first diode is directly connected to the gate of the first transistor; and
the cathode of the second diode is directly connected to the intermediate node and the anode of the second diode is directly connected to the ground.

9. The SOC as recited in claim 7 in which the first terminal of the second capacitor is directly connected to the gate of the first transistor and the second terminal of the second capacitor is directly connected to the ground.

10. The SOC as recited in claim 7 including:
a second resistor coupled in series with a third diode and a fourth diode between a power input and a ground; and
a fifth diode having a first terminal coupled between the second resistor and the third diode and a second terminal coupled to the intermediate node.

11. The SOC as recited in claim 10 including:
a third resistor coupled between the gate of the power transistor and the ground; and
a second transistor having a first terminal coupled to the gate of the power transistor through a sixth diode, having a source coupled to the ground, and a having a gate coupled to the ground.

12. The SOC as recited in claim 7 in which the first terminal of the first capacitor is directly connected to the input node and the second terminal is directly connected to the intermediate node.

13. A system on a chip (SOC) comprising:
a transceiver driver coupled to provide differential output signals on a first protected pin and a second protected pin;
a first electrostatic discharge (ESD) circuit coupled between the first protected pin and a ground and having an ESD gate input;
a second ESD circuit coupled between the second protected pin and the ground and having an ESD gate input; and
a direct power injection (DPI) circuit including:
an output node coupled to the ESD gate inputs of the first and second ESD circuits;
input nodes coupled to the protected pins, the protected pins receiving ESD events that turn on the first and second ESD circuits and receiving smaller, cumulative, oscillating voltage noise effects that can cause the ESD circuits to turn on;
a first transistor having a drain coupled to the output node, a source coupled to the ground, and a gate;
a charge accumulation circuit connected between the input nodes and the gate of the first transistor, the charge accumulation circuit including:
a first capacitor having a first terminal connected to the input nodes and having a second terminal connected to an intermediate node;
a first diode having an anode connected to the intermediate node and having a cathode connected to the gate of the first transistor;
a second diode having a cathode connected to the intermediate node and having an anode connected to the ground; and
a second capacitor having a first terminal connected to the gate of the first transistor and having a second terminal connected to the ground; and a first resistor having a first terminal coupled to the gate of the first transistor and a second terminal coupled to the ground;

the first capacitor, the second capacitor, and the resistor being tuned in response to the cumulative, oscillating voltage noise effects to build up charge on the gate of the first transistor to turn on the first transistor and turn off the first and second ESD circuits.

14. The SOC as recited in claim 13 in which the first terminal of the first capacitor is directly connected to the input nodes and the second terminal is directly connected to the intermediate node;

the anode of the first diode is directly connected to the intermediate node and the cathode of the first diode is directly connected to the gate of the first transistor; and the cathode of the second diode is directly connected to the intermediate node and the anode of the second diode is directly connected to the ground.

15. The SOC as recited in claim 13 in which the first terminal of the second capacitor is directly connected to the gate of the first transistor and the second terminal of the second capacitor is directly connected to the ground.

16. The SOC as recited in claim 13 including:

a second resistor coupled in series with a third diode and a fourth diode between a power input and the ground; and a fifth diode having a first terminal coupled between the second resistor and the third diode and a second terminal coupled to the intermediate node.

17. The SOC as recited in claim 13 in which the transceiver driver is for a controller access network.

18. The SOC as recited in claim 13 in which the transceiver driver is for an engine controller unit.

19. The SOC as recited in claim 13 in which the transceiver driver is for a local interconnect.

20. The SOC as recited in claim 13 in which at least one of the first and second ESD circuits includes:

a first power transistor and a second power transistor coupled in series between a protected pin and the ground, the gate of each of the first and second power transistors being coupled to the ESD gate input;

a third resistor coupled between the gate of the first power transistor and the ESD gate input; and a fourth resistor coupled between the gate of the second power transistor and the ground.

21. The SOC as recited in claim 20 in which the at least one of the first and second ESD circuits includes:

a third capacitor coupled between the gate of the first power transistor and a point between the first and second power transistors;

a fourth capacitor coupled between the gate of the second power transistor and a point between the first and second power transistors.

* * * * *